United States Patent [19]
Taylor

[11] Patent Number: 6,063,235
[45] Date of Patent: May 16, 2000

[54] GAS DISCHARGE APPARATUS FOR WAFER ETCHING SYSTEMS

[75] Inventor: William D. Taylor, Southbury, Conn.

[73] Assignee: PlasmaSil, LLC, St. Peters, Mo.

[21] Appl. No.: 09/134,206

[22] Filed: Aug. 14, 1998

[51] Int. Cl.$^7$ .................................................. C23C 16/00
[52] U.S. Cl. ...................... 156/345; 118/723 E; 118/715
[58] Field of Search .................. 156/345; 118/723 E, 118/715

[56] References Cited

U.S. PATENT DOCUMENTS

| | | | |
|---|---|---|---|
| 4,612,077 | 9/1986 | Tracy et al. ............................. | 156/345 |
| 5,266,153 | 11/1993 | Thomas .................................. | 156/643 |
| 5,372,674 | 12/1994 | Steinberg ............................... | 156/643 |
| 5,391,252 | 2/1995 | Taylor .................................... | 156/345 |
| 5,515,167 | 5/1996 | Ledger et al. ......................... | 356/357 |
| 5,567,255 | 10/1996 | Steinberg ............................... | 156/345 |

*Primary Examiner*—Richard Bueker
*Assistant Examiner*—Erin Fieler
*Attorney, Agent, or Firm*—Senniger, Powers, Leavitt & Roedel

[57] ABSTRACT

A novel gas discharge apparatus for use in a plasma etching system is disclosed. Several components of the gas discharge apparatus including the annular outer chimney, annular outer chimney clamp and annular insulator collar are modified to allow increased egress of particulate matter generated by the etching process away from the substrate being figured. This increased egress results in a significant reduction of contaminants contacting the substrate surface.

11 Claims, 4 Drawing Sheets

GAS DISCHARGE APPARATUS FOR WAFER ETCHING SYSTEMS

BACKGROUND OF THE INVENTION

The present invention relates to wafer etching systems, such as Plasma Assisted Chemical Etching (PACE) systems. More particularly, the present invention relates to a gas discharge apparatus having modified components such that particulate matter and etch by-products generated during the etching process are easily evacuated from the PACE system and substrate surface being etched and resulting substrate contamination is minimized.

Conventional PACE systems are used to etch or figure the surfaces of substrates generally after a rough mechanical grinding and rough polishing step. The PACE process generally uses a gas discharge apparatus having an electrode which is positioned above a substrate to be figured. Radio frequency (RF) power is fed to the electrode and through a positioning table supporting the substrate. A reactive gas flows through the electrode where it is ionized and generates a chemically reactive plasma species which is then discharged onto the surface of the wafer. This plasma discharge chemically reacts with and figures the surface of the wafer to a predetermined shape and/or thickness value.

The shape of the RF generated plasma used to etch the surface is defined by the design of the RF electrode. As the generated plasma moves across the substrate surface and removes material from the surface, particulate matter and etch by-products are generated. Particulate matter, or particulates, can consist of solid matter, gaseous etching by-products, plasma by-products, and ions. The generated matter is evacuated from the plasma combustion chamber of the electrode by means of being entrained in the flow stream from the gas forming the plasma as the excess gas is exhausted via a vacuum pump attached to the PACE reactor chamber away from the substrate surface.

The majority of the plasma generated particulates are removed from the region near the plasma via the flow stream from the gas used to form the plasma. The design of current gas discharge apparatuses, however, limits the ability of the system to effectively remove all particulate matter generated by the figuring of the substrate. Current designs of the annular outer chimney, annular outer chimney clamp, and annular insulator collar portions of the gas discharge apparatus can inhibit the flow of the particulate matter away from the plasma region and substrate surface. These components currently limit the flow of particles in that these particles either contact the annular outer chimney, annular outer chimney clamp or annular insulator collar and, hence, are inhibited from free movement. As the flow of the particulate matter is inhibited, the particulates may contact, and subsequently attach to, the wafer surface. Any particles left on the wafer surface may be subsequently etched away at a different rate than the surrounding silicon. Hence, although the particle is removed, a bump or hill of silicon is left behind on the wafer surface. Such irregularities on the wafer surface can cause numerous problems during the subsequent manufacturing process and device fabrication.

Therefore, a need exists for a design of a gas discharge apparatus for use in a PACE system that can effectively allow generated particulate matter to be removed from the substrate surface and plasma region such that unwanted particulate matter deposited on the wafer is minimized or eliminated.

SUMMARY OF THE INVENTION

Among the objects of the present invention, therefore, are the provision of providing a novel gas discharge apparatus for plasma etching of semiconductor substrates; the provision of a gas discharge apparatus for use in a PACE process which provides improved egress away from the substrate surface for particulate matter generated by the etching process; the provision of a gas discharge apparatus for use in a PACE process capable of reducing the amount of particulate matter contacting the substrate being shaped; and the provision of a gas discharge apparatus for use in a PACE process capable of improving overall throughput.

Briefly, therefore, the present invention is directed to a gas discharge apparatus for use in a plasma etching system for etching a semiconductor substrate. The apparatus is comprised of numerous components including a tubular insulating bolt, annular inner and outer chimneys, an annular electrode, and an annular insulator collar. The annular insulator collar has a first end located proximately to the discharge end of the insulating bolt and a second end opposite the first end such that the diameter of the collar increases generally from the first end toward the second end to allow for improved egress of particulate matter away from the substrate being figured.

The invention is further directed to a gas discharge apparatus for use in a plasma etching system for etching a semiconductor substrate. The apparatus is comprised of numerous components including a tubular insulating bolt, annular inner and outer chimneys, an annular outer chimney clamp, an annular electrode, and an annular insulator collar. The annular outer chimney and annular outer chimney clamp are shaped such that the distance from the annular outer chimney and annular outer chimney clamp to the semiconductor substrate being figured increases as the radial distance from the annular insulating bolt increases.

The invention is further directed to a gas discharge apparatus for use in a plasma etching system for etching a semiconductor substrate. The apparatus is comprised of numerous components including a tubular insulating bolt, annular inner and outer chimneys, an annular outer chimney clamp, an annular electrode, and an annular insulator collar. The annular outer chimney and annular outer chimney clamp are shaped such that the distance from the annular outer chimney and annular outer chimney clamp to the semiconductor substrate being figured increases as the radial distance from the annular insulting bolt increases. The annular insulator collar has a first end located proximately to the discharge end of the insulating bolt and a second end opposite the first end such that the diameter of the collar increases generally from the first end toward the second end to allow for improved egress of particulate matter away from the substrate being figured.

Other objects and features of this invention will be in part apparent and in part pointed out hereinafter.

BRIEF DESCRIPTION OF THE DRAWINGS

Corresponding reference characters indicate corresponding parts throughout the drawings.

DETAILED DESCRIPTION OF THE PREFERRED EMBODIMENTS

In accordance with the present invention, it has been discovered that the amount of particulate matter contacting the surface of a substrate being figured by a PACE system can be significantly reduced by modifying one or more components of the gas discharge apparatus to allow for unimpeded egress of the generated particulate matter away from the substrate surface during figuring. Additionally, it has been demonstrated that modifying the shape of the annular outer chimney, annular outer chimney clamp, and annular insulator collar components of the gas discharge apparatus can substantially improve the egress of unwanted particulate matter generated by the PACE system away from the substrate surface and result in a greatly reduced amount of particulates contacting the surface.

Figure 1:
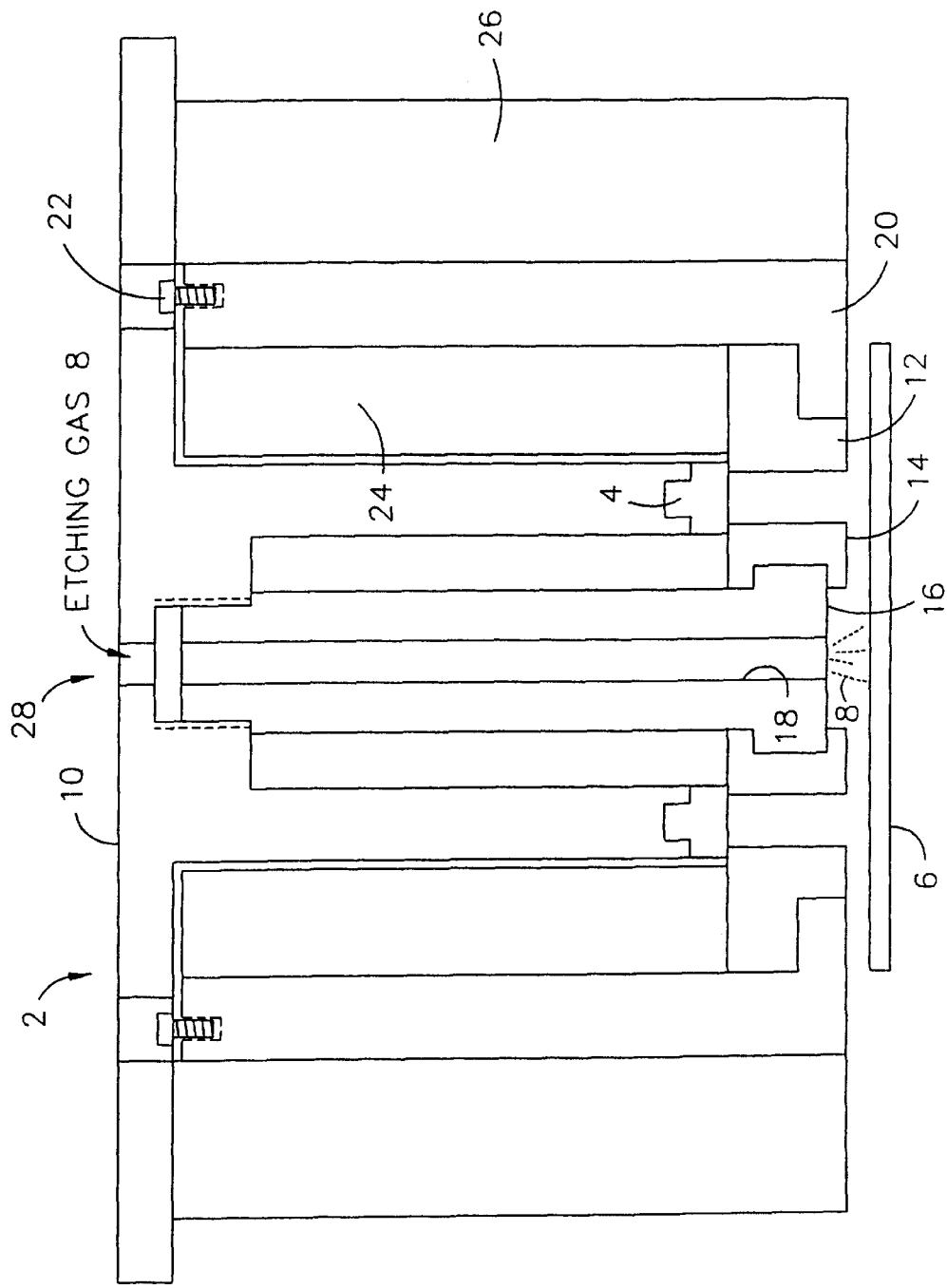
FIG. 1 is a cross sectional view of a gas discharge apparatus.

Referring now to the figures, and more particularly to FIG. 1, there is shown cross sectional view of a gas discharge apparatus 2 having an annular electrode 4. The gas discharge apparatus 2 may be employed to etch a semiconductor substrate 6, such as a silicon wafer, which defines a horizontal surface spaced closely beneath gas discharge apparatus 2. Etching gas 8 is introduced at the center of the annulus of the electrode 4 and subsequently converted to a plasma (not shown) used to figure the substrate 6.

The gas discharge apparatus 2 comprises a housing 10, and the annular electrode 4, which has a predetermined outer diameter and a predetermined inner diameter and is coupled to a RF power source (not shown) and is secured to housing 10. A tubular insulator bolt 16 having an inlet end 28 and a discharge end 18 transports etching gas 8 from the inlet end 28 and exhausts it from the discharge end 18 to the surface of the semiconductor wafer 6 to be etched so that the etching gas 8 is dispersed in a nominally radially symmetric flow pattern over the wafer 6. An annular inner chimney 14 is adjacent to and generally coaxial with the tubular insulating bolt 16. An annular outer chimney 12 is generally coaxial with the insulating bolt and arranged at least partially in spaced apart, radially opposed relation with the inner chimney 14 whereby the inner and outer chimneys define a radial gap. The annular outer chimney 12 and the annular inner chimney 14 act as insulators and confine the plasma discharge from the annular electrode 4. The annular electrode 4 is generally coaxial with the insulating bolt 16 and at least partially in registration with the radial gap. The annular outer chimney 12 is secured to the housing 10 by means of an annular clamp 20 that is mated to the housing 10 by means of bolt 22. An inert annular filler member 24 is disposed in the space between the housing 10, annular clam 20, and annular outer chimney 12. An annular insulator collar 26 is generally coaxial with the insulating bolt and substantially encircles the annular insulating bolt 16, annular electrode 4, inner chimney 14, outer chimney 12, and clamp 20. The collar 26 has a first end located proximately to the discharge end 30 of insulating bolt 16 and a second end opposite the first end. The annular insulator collar provide RF insulation to ensure that the RF signal does not propagate outside the gas discharge apparatus and cause unwanted plasma to form.

The annular electrode 4 may be comprised of a magnesium annulus having a two inch outer diameter and a one inch inner diameter, for example, that may be pressed into a housing 10, which may be water cooled. The housing 10 may be comprised of, for example, aluminum. The process gas 8, such as $SF_6$, $CF_4$, $O_2$, Ar, $N_2$, or various combinations thereof, is introduced through hole 18 into the plasma formation region so that it has a nominally radial symmetric flow. The RF power source (not shown) coupled to the annular electrode 4 creates ionized chemically reactive species from the inert gas which then forms a plasma discharge. Discharge 18 includes a longitudinal hole which may be, for example, approximately ⅛ inch in diameter and have a length long enough to prevent gas discharge from occurring at an inlet 28 where the gas 8 enters the housing 10. The gas expands outward from the injection point at an angle of about 7 degrees and a portion of it forms the plasma, while the remainder exhausts through the flow passage created by the annular outer chimney 12, the annular outer chimney clamp 20, the annular insulator collar 26, and the substrate 6.

The annular inner chimney 14, which may comprised of MACOR® or other substantially inert materials such as magnesium fluoride or magnesium oxide, for example, is held against the face of the annular electrode 4 at is inner diameter by the insulating bolt 16. The outer chimney 12, which may also be comprised of MACOR®, magnesium fluoride, or magnesium oxide for example, is held against a face of the annular electrode 4 at its outer diameter by annular clamp 20, which may be comprised of MACOR®, for example. The annular insulator collar 26, which may be comprised of teflon, for example, is mounted to the annular electrode mounting plate (not shown) with bolts (not shown).

In one embodiment of the present invention, the annular insulator collar component of the gas discharge apparatus of the present invention is shaped so as to improve the ability of the etching gas, which, after being converted to a plasma in the RF field and etching the substrate surface, contains particulates, to be evacuated from the etching apparatus by vacuum to minimize the possibility of the deposition of particulates on the substrate. Generally, the bottom wall of the inner chimney is between about 0.1 and about 6 millimeters from the substrate being figured. This provides sufficient distance for the reactive plasma to form and figure the substrate surface, and for particulate matter to be evacuated.

Figure 2:
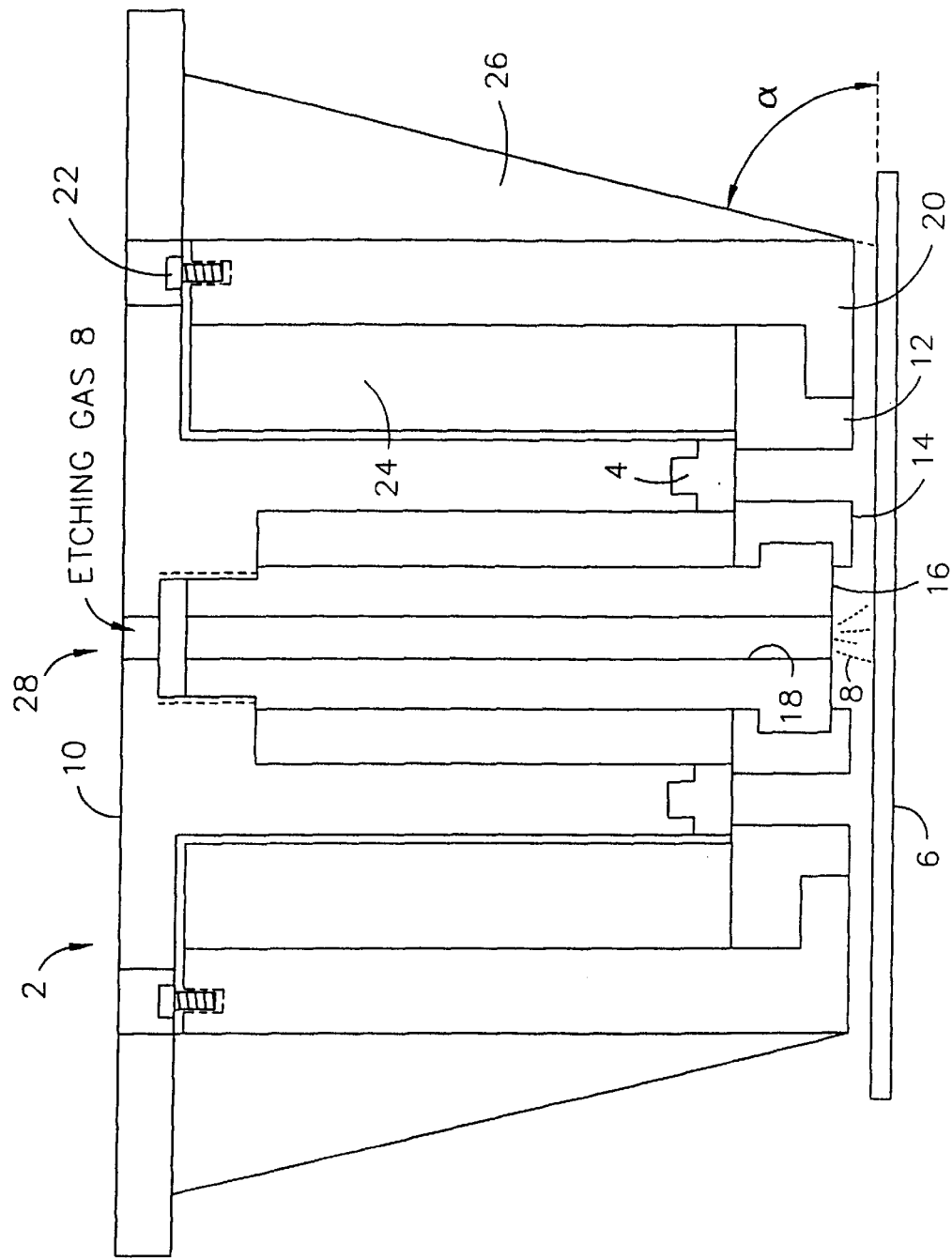
FIGS. 2, 3, and 4 are cross sectional views of a gas discharge apparatus in accordance with the principles of the present invention.

Referring now to FIG. 2, there is shown a gas discharge apparatus 2 containing a shaped annular insulator collar 26 in accordance with one embodiment of present invention. It is shown that the diameter of the annular insulator collar 26 increases generally from the bottom of the annular insulator collar to its top such that the outer face of the annular insulator collar 26 inclines upward and outward relative to the bottom of the annular outer chimney clamp 20. This tapering of the annular insulator collar 26 does not affect its ability to insulate against RF propagation and unwanted plasma formation. The tapering, however, does allow for the flow of particulate matter generated from the plasma etching of the substrate surface to move unimpeded past the annular collar 26 and to be efficiently removed away from the substrate surface by a vacuum system attached to the PACE reactor chamber. For purposes of the present invention, the shaping of the annular insulator collar 26 should be such that the angle alpha formed between the substrate 6 and the tapered bottom surface of the annular insulator collar 26 is at least about 7 degrees. At an angle of at least about 7 degrees the deposition of unwanted particulate matter on the substrate surface is minimized.

In another embodiment of the present invention, the annular outer chimney and annular outer chimney clamp are shaped so as to improve the ability of the etching gas which, after being converted to a plasma in the RF field, contains particulates, to be evacuated from the etching apparatus by vacuum to minimize the possibility of deposition on the substrate.

Figure 3:
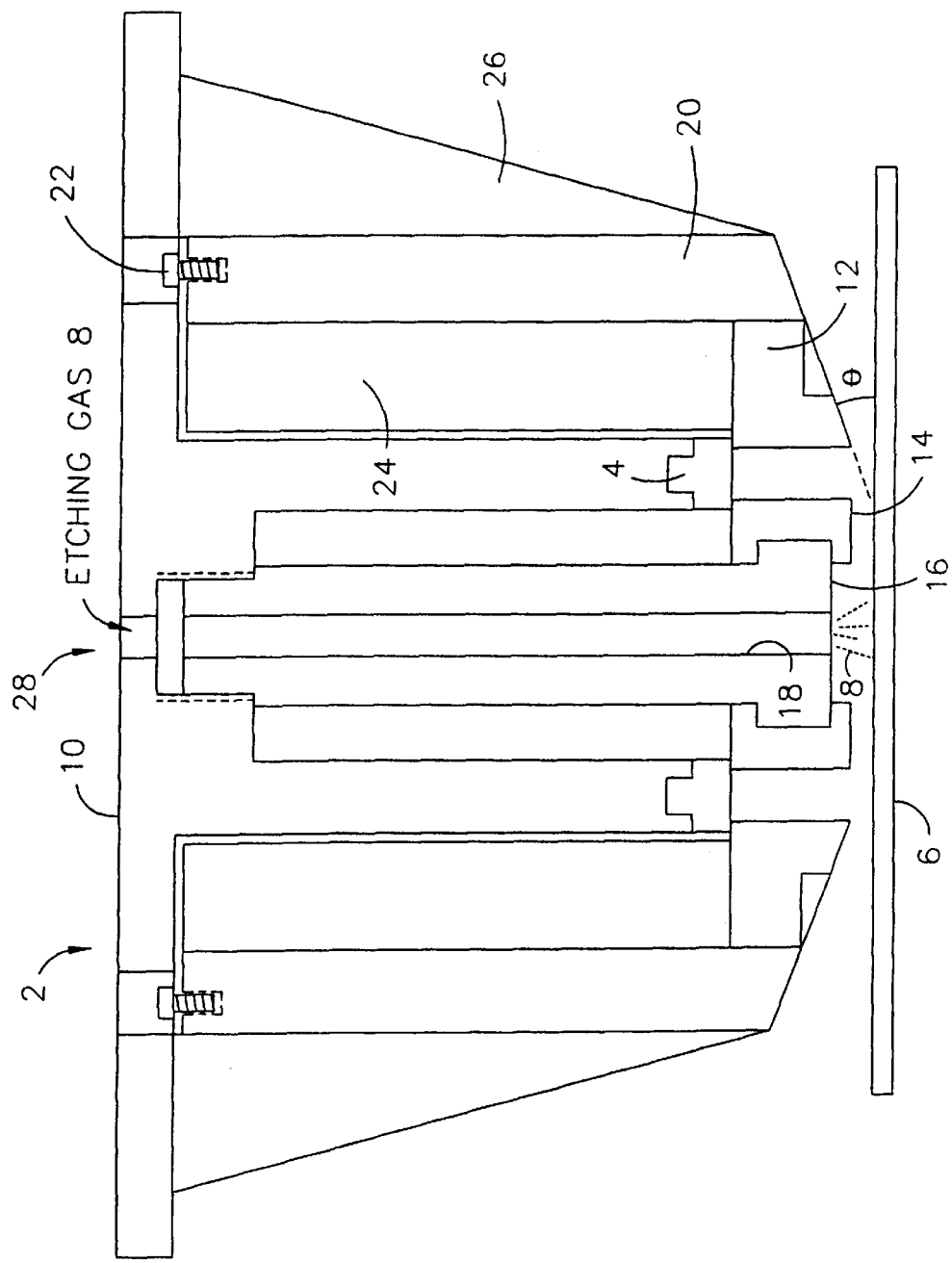

Referring now to FIG. 3, there is shown a gas discharge apparatus 2 containing a shaped annular outer chimney 12 and annular outer chimney clamp 20 in accordance with one embodiment of the present invention. It is shown that the distance from the substrate 6 to the annular outer chimney 12 and annular outer chimney clamp 20 increases as the radial distance from the insulating bolt 16 increases. The shaping of the annular outer chimney 12 and annular outer chimney clamp 20 should be such that the angle theta formed between the substrate 6 and the tapered bottom surface of the annular outer chimney 12 and annular outer chimney clamp 20 is between about 7 and about 45 degrees, preferably between about 10 and about 30 degrees. This shaping of the annular outer chimney and annular outer chimney clamp allows particulate matter generated from the plasma etching to be efficiently removed away from the substrate surface, thus minimizing deposition of unwanted particulate matter on the substrate surface. It will be recognized by one skilled in the art that the annular insulating collar 26 should be shaped so as not to impair the increased egress of particulates created by the shaping of the annular outer chimney 12 and annular outer chimney clamp 20. An appropriate shaping of the annular insulator collar 26 is also shown in FIG. 3.

In another embodiment of the present invention, the annular outer chimney, annular outer chimney clamp, and annular insulator collar are shaped so as to improve the ability of the etching gas to be evacuated from the etching apparatus by vacuum to minimize the possibility of deposition of particulates on the substrate 6.

Figure 4:
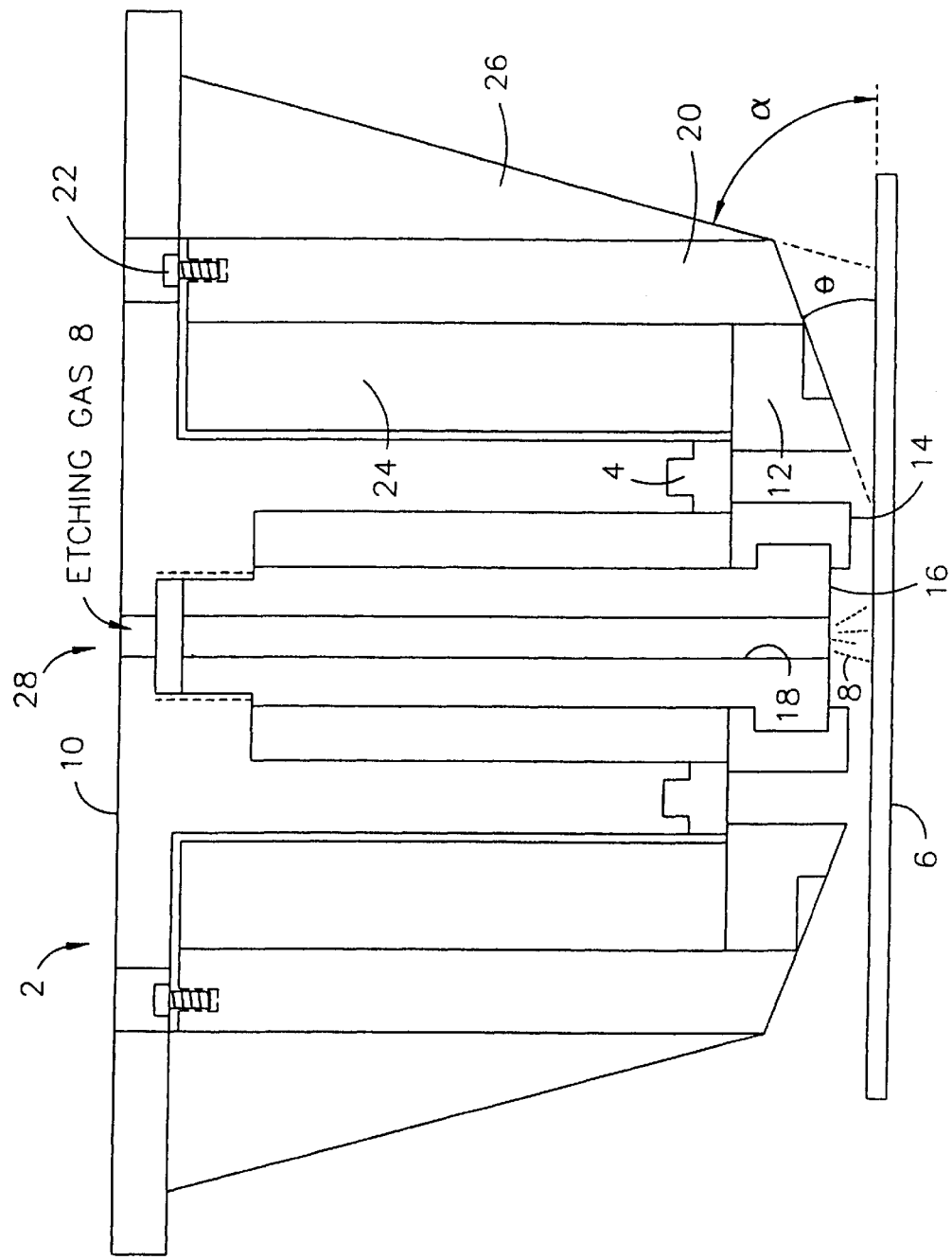

Referring now to FIG. 4, there is shown a gas discharge apparatus 2 containing a shaped annular outer chimney 12, annular outer chimney clamp 20, and annular insulator collar 26 in accordance with one embodiment of the present invention. It is shown that the distance from the substrate 6 to the annular outer chimney 12, annular outer chimney clamp 20 and annular insulator collar 26 increases as the radial distance from the insulating bolt 16 increases. This shaping of these three components provides for maximum increased egress for particulate matter generated during the etching process.

In a preferred embodiment of the present invention, the annular outer chimney and annular outer chimney clamp are tapered and shaped such that the angle of inclination, theta, defined as the angle between the substrate and the tapered bottom surfaces of the annular outer chimney and the annular outer chimney clamp is between about 7 and about 45 degrees, preferably between about 10 and about 30 degrees. The annular insulator collar 26 is tapered and shaped such that the angle of inclination alpha between the substrate 6 and the tapered bottom surface of the annular insulator collar 26 is between about 7 and about 45 degrees. In the preferred embodiment, the angle of inclination alpha is equal to or greater than the angle of inclination theta to ensure that the annular insulator collar does not impede the egress of the particulates. This range of appropriate inclination angles theta and alpha provides for an unimpeded egress by the annular outer chimney, annular outer chimney clamp and annular insulator collar for the particles suspended near the plasma chamber to the vacuum pump out port. Thus, at these angles, the amount of particulate matter contacting the substrate is minimized. It will be understood by one skilled in the art that the proper selection of angles theta and alpha will depend on several variables including gas flow properties such as velocity and pressure, the plasma conversion efficiency, and the size of the vacuum pump.

In view of the above, it will be seen that the several objects of the invention are achieved.

As various changes could be made in the above-described gas discharge apparatus without departing from the scope of the invention, it is intended that all matter contained in the above description be interpreted as illustrative and not in a limiting sense.

What is claimed is:

1. A gas discharge apparatus for use in a plasma etching system for etching a surface of a semiconductor wafer, the semiconductor wafer defining a generally horizontal surface in closely spaced relationship beneath the apparatus, the gas discharge apparatus comprising:

a tubular insulating bolt having an inlet end and a discharge end, the bolt being capable of transporting etching gas from the inlet end and exhausting it from the discharge end to the surface of the semiconductor wafer to be etched for dispersion of the gas in a nominally radially symmetric flow pattern over the wafer surface;

an annular inner chimney adjacent to and generally coaxial with the insulating bolt;

an annular outer chimney generally coaxial with the insulating bolt and arranged at least partially in spaced apart, radially opposed relation with the inner chimney whereby the inner and outer chimneys define a radial gap;

an annular electrode generally coaxial with the insulating bolt and at least partially in registration with the radial gap;

an annular insulator collar generally coaxial with the insulating bolt and substantially encircling the insulating bolt, electrode and inner and outer chimneys, the annular insulator collar having a first end located proximately to the discharge end of the insulating bolt and a second end opposite the first end, the insulator collar having a diameter which increases generally from the first end toward the second end.

2. The apparatus as set forth in claim 1 wherein the semiconductor wafer is between about 0.1 and about 6 millimeters beneath a bottom surface of the annular inner chimney.

3. The apparatus as set forth in claim 1 wherein an outer face of the insulating collar inclines upward and outward relative to the bottom of the outer chimney, and the semiconductor wafer defining a generally horizontal surface beneath the apparatus and the outer face of the annular insulator collar form an inclination angle of at least about 7 degrees.

4. A gas discharge apparatus for use in a plasma etching system for etching a surface of a semiconductor wafer, the semiconductor wafer defining a generally horizontal surface in closely spaced relationship beneath the apparatus, the gas discharge apparatus comprising:

a tubular insulating bolt having an inlet end and a discharge end, the bolt being capable of transporting etching gas from the inlet end and exhausting it from the discharge end to the surface of the semiconductor wafer to be etched for dispersion of the gas in a nominally radially symmetric flow pattern over the wafer surface;

an annular inner chimney adjacent to and generally coaxial with the insulating bolt;

an annular outer chimney generally coaxial with the insulating bolt and arranged at least partially in spaced apart, radially opposed relation with the inner chimney whereby the inner and outer chimneys define a radial gap, the annular outer chimney being tapered such that the distance from the annular outer chimney to the semiconductor wafer increases as the radial distance from the insulating bolt increases;

an annular outer chimney clamp generally coaxial with the insulating bolt and arranged at least partially in spaced apart, radially opposed relation with the inner chimney, the annular outer chimney clamp being tapered such that the distance from the annular outer chimney clamp to the semiconductor wafer increases as the radial distance from the insulating bolt increases; and an annular electrode generally coaxial with the insulating bolt and at least partially in registration with the radial gap.

5. The apparatus as set forth in claim 4 wherein the semiconductor wafer is between about 0.1 and about 6 millimeters beneath a bottom surface of the annular inner chimney.

6. The apparatus as set forth in claim 4 wherein the semiconductor wafer defining a generally horizontal surface beneath the apparatus and the tapered annular outer chimney and annular outer chimney clamp form an inclination angle of between about 7 and about 45 degrees.

7. The apparatus as set forth in claim 4 wherein the semiconductor wafer defining a generally horizontal surface beneath the apparatus and the tapered annular outer chimney and annular outer chimney clamp form an inclination angle of between about 10 and about 30 degrees.

8. A gas discharge apparatus for use in a plasma etching system for etching a surface of a semiconductor wafer, the semiconductor wafer defining a generally horizontal surface in closely spaced relationship beneath the apparatus, the gas discharge apparatus comprising:

a tubular insulating bolt having an inlet end and a discharge end, the bolt being capable of transporting etching gas from the inlet end and exhausting it from the discharge end to the surface of the semiconductor wafer to be etched for dispersion of the gas in a nominally radially symmetric flow pattern over the wafer surface;

an annular inner chimney adjacent to and generally coaxial with the insulating bolt;

an annular outer chimney generally coaxial with the insulating bolt and arranged at least partially in spaced apart, radially opposed relation with the inner chimney whereby the inner and outer chimneys define a radial gap, the annular outer chimney being tapered such that the distance from the annular outer chimney to the semiconductor wafer increases as the radial distance from the insulating bolt increases;

an annular outer chimney clamp generally coaxial with the insulating bolt and arranged at least partially in spaced apart, radially opposed relation with the inner chimney, the annular outer chimney clamp being tapered such that the distance from the annular outer chimney clamp to the semiconductor wafer increases as the radial distance from the insulating bolt increases;

an annular electrode generally coaxial with the insulating bolt and at least partially in registration with the radial gap; and an annular insulator collar generally coaxial with the insulating bolt and substantially encircling the insulating bolt, electrode and inner and outer chimneys, the annular insulator collar having a first end located proximately to the discharge end of the insulating bolt and a second end opposite the first end, the insulator collar having a diameter which increases generally from the first end toward the second end.

9. The apparatus as set forth in claim 8 wherein the semiconductor wafer is between about 0.1 and about 6 millimeters beneath a bottom surface of the annular inner chimney.

10. The apparatus as set forth in claim 8 wherein an outer face of the insulating collar inclines upward and outward relative to the bottom of the outer chimney, the semiconductor wafer defining a generally horizontal surface beneath the apparatus and the tapered annular outer chimney and annular outer chimney clamp form an inclination angle of between about 7 and about 45 degrees and the semiconductor wafer and the outer face of the annular insulator collar form an inclination angle of at least about 7 degrees.

11. The apparatus as set forth in claim 10 wherein the inclination angle between the semiconductor wafer and the outer face of the annular insulator collar is at least equal to the inclination angle between the semiconductor wafer and the tapered annular outer chimney and annular outer chimney clamp.

* * * * *